(12) United States Patent
Bausch et al.

(10) Patent No.: US 9,209,082 B2
(45) Date of Patent: Dec. 8, 2015

(54) METHODS OF LOCALIZED HARDENING OF DICING CHANNEL BY APPLYING LOCALIZED HEAT IN WAFER KERF

(71) Applicant: International Business Machines Corporation, Armonk, NY (US)

(72) Inventors: Matthew G. Bausch, South Burlington, VT (US); Eric D. Marz, Winooski, VT (US); Benjamin J. Pierce, South Burlington, VT (US); Jared P. Yanofsky, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 14/147,207

(22) Filed: Jan. 3, 2014

(65) Prior Publication Data

US 2015/0194346 A1 Jul. 9, 2015

(51) Int. Cl.
*H01L 21/00* (2006.01)
*H01L 21/78* (2006.01)
*H01L 21/768* (2006.01)

(52) U.S. Cl.
CPC .......... *H01L 21/78* (2013.01); *H01L 21/76838* (2013.01)

(58) Field of Classification Search
None
See application file for complete search history.

(56) References Cited

U.S. PATENT DOCUMENTS

| | | | |
|---|---|---|---|
| 3,991,296 A | 11/1976 | Kojima et al. | |
| 5,543,365 A | 8/1996 | Wills et al. | |
| 7,566,635 B2 | 7/2009 | Fujii et al. | |
| 7,749,867 B2 | 7/2010 | Fukuyo et al. | |
| 7,767,557 B2 | 8/2010 | Reeder | |
| 2005/0029669 A1* | 2/2005 | Inoue et al. | 257/774 |
| 2006/0160269 A1* | 7/2006 | Rajagopalan et al. | 438/106 |
| 2006/0249816 A1* | 11/2006 | Li et al. | 257/618 |
| 2008/0194051 A1* | 8/2008 | Chu et al. | 438/33 |
| 2011/0241142 A1* | 10/2011 | Matsubara | 257/422 |

FOREIGN PATENT DOCUMENTS

JP 2004214431 A 7/2004

OTHER PUBLICATIONS

Nakao, "Prevention of Dicing Debris by Polyimide Surface Cure", IPCOM000104062D, Mar. 1, 1993, IP.com Prior Art Database Technical Disclosure.

* cited by examiner

*Primary Examiner* — Michael Jung
(74) *Attorney, Agent, or Firm* — Steven J Meyers; Hoffman Warnick LLC

(57) ABSTRACT

Various embodiments include localized hardening of dicing channels in an integrated circuit (IC) wafer. In some embodiments, a method includes: applying localized heat to a metal interconnect in a wafer kerf on an IC wafer using a heat source; and removing the heat source to cool the metal interconnect after the applying of the localized heat to the metal interconnect, wherein the applying of the heat and the removing of the heat source increases a hardness of the metal interconnect.

19 Claims, 4 Drawing Sheets

METHODS OF LOCALIZED HARDENING OF DICING CHANNEL BY APPLYING LOCALIZED HEAT IN WAFER KERF

BACKGROUND

The subject matter disclosed herein relates to integrated circuit devices. More particularly, the subject matter relates to fabrication of integrated circuit devices.

As integrated circuit technologies have advanced, the size of these devices has correspondingly decreased. In particular, as devices are reduced in scale to comply with ever-smaller packaging, tighter constraints are applied to their dimensions and spacings.

Integrated circuit (IC) chips are formed by fabricating a plurality of devices on a wafer, and dicing the wafer along kerf lines separating the devices, to form a plurality of individual chips. However, as IC chips have become thinner, the silicon-to-metal ratio in the kerf area of the wafers makes dicing of those chips more cumbersome and time consuming.

SUMMARY

Various embodiments include localized hardening of dicing channels in an integrated circuit (IC) wafer. In some embodiments, a method includes: applying localized heat to a metal interconnect in a wafer kerf on an IC wafer using a heat source; and removing the heat source to cool the metal interconnect after the applying of the localized heat to the metal interconnect, wherein the applying of the heat and the removing of the heat source increases a hardness of the metal interconnect.

A first aspect includes a method including: applying localized heat to a metal interconnect in a wafer kerf on an IC wafer using a heat source; and removing the heat source to cool the metal interconnect after the applying of the localized heat to the metal interconnect, wherein the applying of the heat and the removing of the heat source increases a hardness of the metal interconnect.

A second aspect includes a method including: contacting a heating element to a probe pad on an IC wafer, the IC wafer including: a wafer kerf separating adjacent IC chips, the wafer kerf including a metal interconnect electrically connected with the probe pad; and a dielectric at least partially surrounding the metal interconnect; heating the probe pad with the heating element to raise a temperature of the metal interconnect while maintaining a temperature of the dielectric below the temperature of the metal interconnect; and removing the heating element from the probe pad to cool the metal interconnect after the heating of the probe pad, wherein the heating of the probe pad and the removing of the heating element increases a hardness of the metal interconnect.

A third aspect includes a method including: contacting a ceramic heating element to a probe pad on an IC wafer, the IC wafer including: a wafer kerf separating adjacent IC chips, the wafer kerf including a metal interconnect electrically connected with the probe pad; and a dielectric at least partially surrounding the metal interconnect; heating the probe pad with the ceramic heating element to raise a temperature of the metal interconnect while maintaining a temperature of the dielectric below the temperature of the metal interconnect; removing the heating element from the probe pad to cool the metal interconnect after the heating of the probe pad, wherein the heating of the probe pad and the removing of the heating element increases a hardness of the metal interconnect; and dicing the IC wafer along the wafer kerf after the removing of the heating element.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
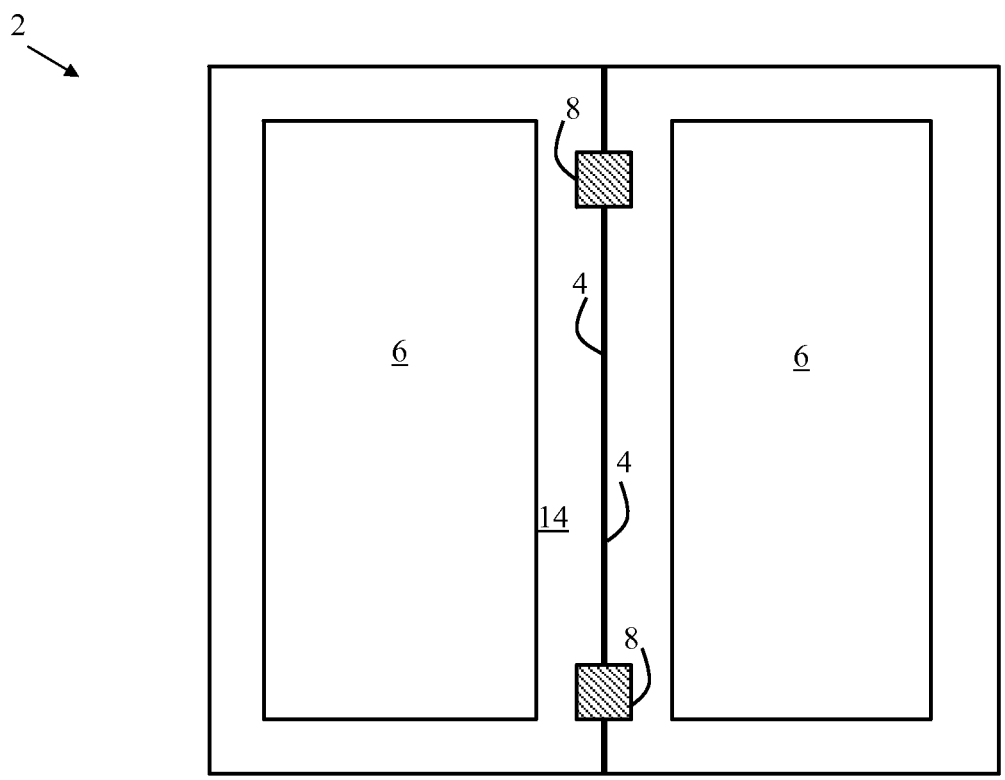
FIG. 1 shows a schematic top view of an integrated circuit (IC) wafer 2 according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit devices. More particularly, the subject matter relates to fabrication of integrated circuit devices.

As noted herein, integrated circuit (IC) chips are formed by fabricating a plurality of devices on a wafer, and dicing the wafer along kerf lines separating the devices, to form a plurality of individual chips. However, as IC chips have become thinner, the silicon-to-metal ratio in the kerf area of the wafers makes dicing of those chips more cumbersome and time consuming. That is, conventional dicing saws are designed for dicing wafers having a high silicon-to-metal ratio; and more modern wafers, with a lower silicon-to-metal ratio, have less silicon to clean the dicing saw from the build-up of metal and polysilicon. During dicing, this lower silicon-to-metal ratio reduces the efficiency of dicing, causing build-up on the dicing saw.

According to various embodiments, methods include localized hardening of the dicing channels in wafer kerfs prior to dicing of the IC chips from the wafer. Various methods include performing localized hardening of the dicing channels after device testing. These methods can enhance the dicing efficiency of traditional dicing saws in cutting modern IC chips from wafers.

Various particular embodiments include a method including: applying localized heat to a metal interconnect in a wafer kerf on an IC wafer using a heat source; and removing the heat source to cool the metal interconnect after the applying of the localized heat to the metal interconnect, wherein the applying of the heat and the removing of the heat source increases a hardness of the metal interconnect.

Various other embodiments include a method including: contacting a heating element to a probe pad on an IC wafer, the IC wafer including: a wafer kerf separating adjacent IC chips, the wafer kerf including a metal interconnect electrically connected with the probe pad; and a dielectric at least partially surrounding the metal interconnect; heating the probe pad with the heating element to raise a temperature of the metal interconnect while maintaining a temperature of the dielectric below the temperature of the metal interconnect;

and removing the heating element from the probe pad to cool the metal interconnect after the heating of the probe pad, wherein the heating of the probe pad and the removing of the heating element increases a hardness of the metal interconnect.

Various additional embodiments include a method including: contacting a ceramic heating element to a probe pad on an IC wafer, the IC wafer including: a wafer kerf separating adjacent IC chips, the wafer kerf including a metal interconnect electrically connected with the probe pad; and a dielectric at least partially surrounding the metal interconnect; heating the probe pad with the ceramic heating element to raise a temperature of the metal interconnect while maintaining a temperature of the dielectric below the temperature of the metal interconnect; removing the heating element from the probe pad to cool the metal interconnect after the heating of the probe pad, wherein the heating of the probe pad and the removing of the heating element increases a hardness of the metal interconnect; and dicing the IC wafer along the wafer kerf after the removing of the heating element.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Figure 2:
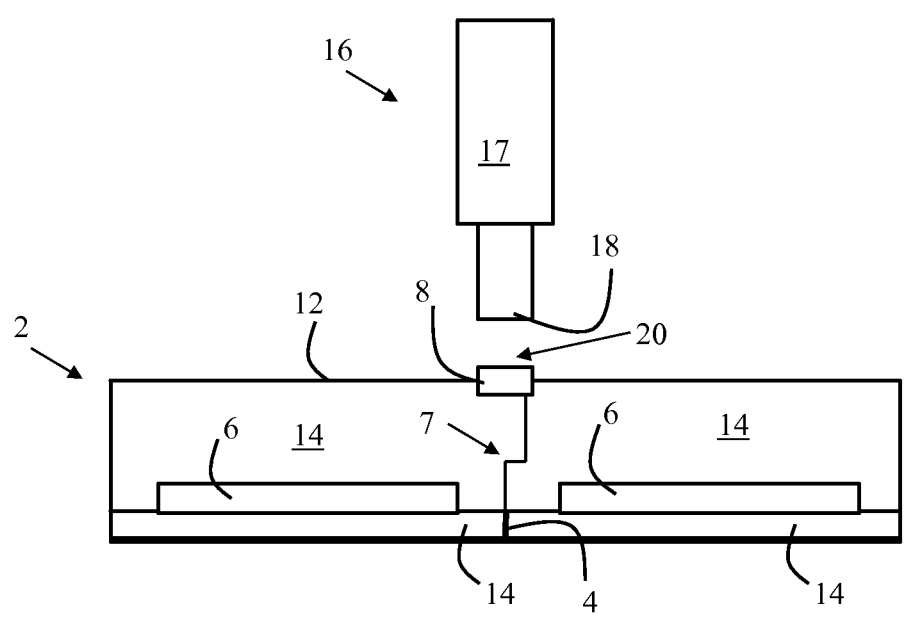
FIG. 2 shows a schematic side view of the IC wafer 2 of FIG. 1.
Figure 3:
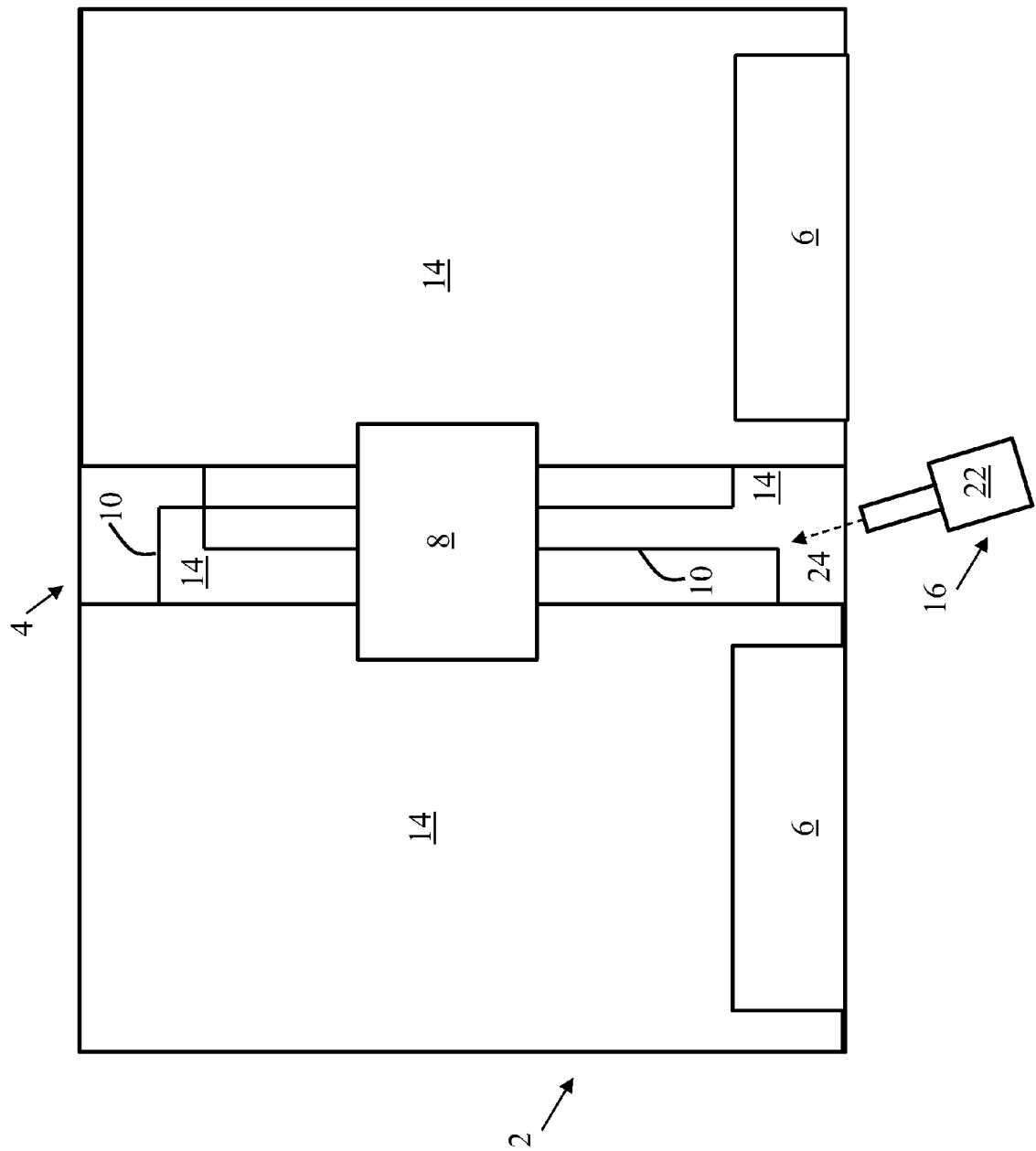
FIG. 3 shows a close-up schematic top view of the IC wafer 2 of FIGS. 1 and 2.

FIG. 1 shows a schematic top view of an integrated circuit (IC) wafer 2 according to various embodiments. FIG. 2 shows a schematic side view of the IC wafer 2 of FIG. 1; and FIG. 3 shows a close-up schematic top view of the IC wafer 2 of FIGS. 1 and 2. Referring to FIGS. 1-3, the IC wafer 2 can include a wafer kerf 4 separating adjacent IC chips 6 prior to dicing of those IC chips 6 for end use. The IC wafer 2 can include a probe pad 8, and the wafer kerf 4 can include a metal interconnect 10 (FIG. 3) electrically connected with the probe pad 8 via wiring 7 (e.g., inter-level wiring). The metal interconnect 10 can include one or more interconnect metals known in the art, for example, copper (Cu), aluminum (Al), alloys of Cu and/or Al, etc. FIG. 3 shows a close-up view of the wafer kerf 4, illustrating the metal interconnect 10 in greater detail. The probe pad 8 can include a conductive pad (e.g., copper, aluminum, etc.) that is electrically connected with the metal interconnect 10. As shown most clearly in FIG. 2, the probe pad 8 is located on an upper surface 12 of the IC wafer 2.

The IC wafer 2 can further include a dielectric 14 at least partially surrounding the metal interconnect 10 (and insulating components in and around the IC chips 6). As is known in the art, the wafer kerf 4 can define a separation between adjacent IC chips 6 for subsequent dicing (cutting) of the IC chips 6, prior to packaging, shipment, use, etc. of those IC chips 6. In various embodiments, the dielectric 14 can include at least one of: silicon dioxide (SiO2), silicon oxygen fluoride (SiOF), silicon nitride (SiN), silicon carbide (SiC), carbo-silicon nitride (C—SiN), cadmium oxide (CdO) or combinations thereof. In some cases, where the dielectric layer 14 includes an ILD layer, that ILD can include at least one of: silicon nitride (Si3N4), silicon oxide (SiO2), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

It is understood that as described herein, the IC wafer 2 can include a post-test wafer. That is, the IC wafer 2 shown and described according to various embodiments, has completed performance testing and is otherwise ready for dicing prior to the processes illustrated herein.

FIG. 2 shows one embodiment of a heat source 16, which may be utilized according to various embodiments described herein. According to various embodiments, the heat source 16 can include a heating element 17, e.g., a ceramic heating element. In some cases, the heating element 17 can have a contact surface 18 sized to coincide with a contact surface 20 of the probe pad 8 of the IC wafer 2 in order to conduct heat to the probe pad 8, according to various embodiments FIG. 3 shows another example of a heat source 16, which may be utilized according to various embodiments described herein. In some cases, the heat source 16 can include a laser light source 22, configured to provide focused laser light 24 for heating the metal interconnect 10 according to various embodiments.

Figure 4:
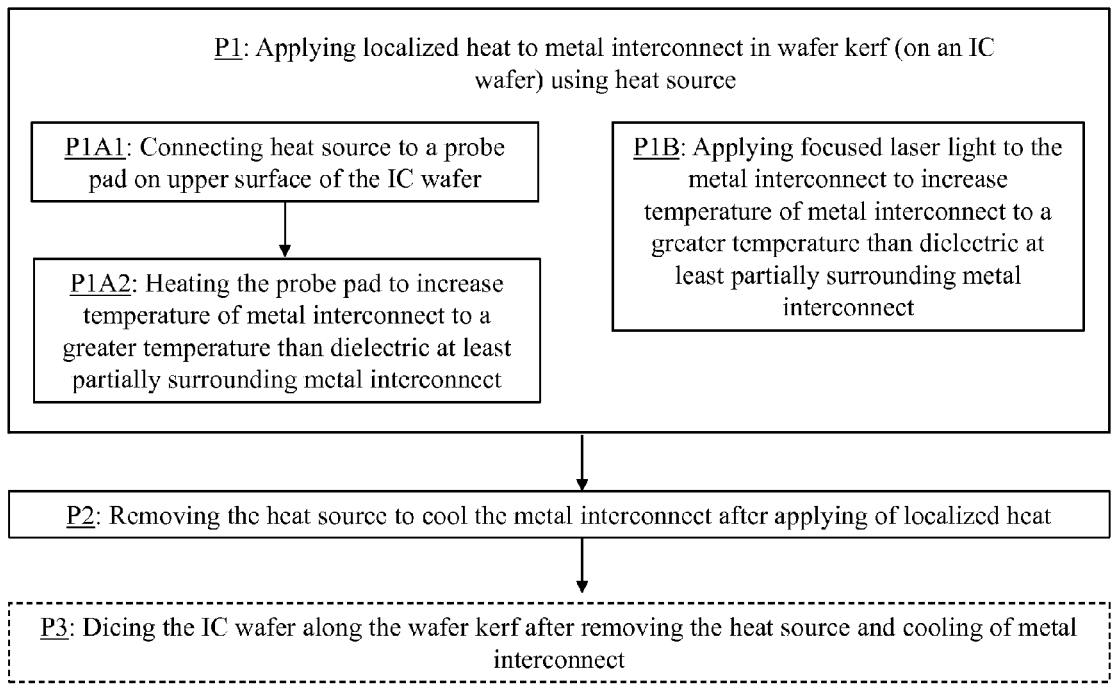
FIG. 4 depicts a flow diagram illustrating processes according to various embodiments.

FIG. 4 is a flow diagram illustrating processes performed according to various embodiments. The flow diagram of FIG. 4 will be described with reference to the schematic depictions of the IC wafer 2 in FIGS. 1-3. In some embodiments, a process according to various embodiments can include:

Process P1: applying localized heat to the metal interconnect 10 in the wafer kerf 4 on the IC wafer 2 using a heat source 16 (e.g., heating element 17 or laser light source 22). In various embodiments, e.g., where the heat source 16 includes a heating element 17, this process can include sub-processes:

Process P1A1: connecting the heat source 16 (e.g., heating element 17 such as a ceramic heating element) to a probe pad 8 on an upper surface 12 of the IC wafer 2. In various embodiments, this includes physically touching the heat source 16 to the probe pad 8. As described herein, the probe pad 8 is electrically connected with the metal interconnect 10 in the wafer kerf 4, such that heat traveling from the probe pad 8 will conduct through wiring 7 connecting the probe pad 8 with the metal interconnect. Further, the metal interconnect 10 is at least partially surrounded by the dielectric 14 which conducts heat less effectively (less quickly) than the wiring 7 and the metal interconnect 10. As described herein, the metal interconnect 10 can be formed of Cu, Al, alloys of Cu, alloys of Al and/or alloys of Al and Cu.

Process P1A2: (after connecting the heat source 16 to the probe pad 8), heating the probe pad 8 to increase a temperature of the metal interconnect 10 to a greater temperature than a temperature of the dielectric 14 at least partially surrounding the metal interconnect 10. That is, due to the higher thermal conductivity of the metal interconnect 10 relative to the dielectric 14 the temperature of the metal interconnect 10 will increase to a greater extent than the surrounding dielectric 14 (e.g., where ambient temperature is approximately 20 degrees Celsius, and the metal interconnect 10 includes Cu, if the metal interconnect 10 were to be heated to a temperature of approximately 500 degrees Celsius, the dielectric, e.g., SiO$_2$, will be heated to a temperature of approximately 24 degrees Celsius). For example, for a dielectric 14 including silicon dioxide (SiO2), the thermal conductivity of that dielectric is approximately 1.4 W/mK. In contrast, the thermal conductivity of Al is approximately 205 W/mK; and the thermal conductivity of Cu is approximately 400 W/mK. The differential in thermal conductivity between the metal interconnect 10 (e.g., Al and/or Cu) and the dielectric can enhance the temperature differential between these portions of the IC wafer 2.

In an alternative process P1B, the applying of the localized heat includes applying a focused laser light 24 (e.g., from laser light source 22) to the metal interconnect 10. This process can include directly applying the focused laser light 24 to the metal interconnect 10 without necessarily contacting the probe pad 8. This laser-based approach can similarly increase the temperature of the metal interconnect 10 without a corresponding increase in the temperature of the dielectric 14.

Following process P1 (including processes P1A1-P1A2 or P1B), the process can include:

Process P2: removing the heat source 16 to cool the metal interconnect 10 after the applying of the localized heat to the metal interconnect 10. In some cases, for example, where the metal interconnect 10 includes Cu, the metal interconnect 10 can be passively cooled, that is, allowed to cool naturally over time after removal of the heat source 16. In other cases, for example, where the metal interconnect 10 includes Al, the metal interconnect 10 can be actively cooled, e.g., by forcing cool air over the wafer kerf 4 and/or IC wafer 2 and/or placing the IC wafer 2 in a cooled environment.

In any case, the process of applying localized heat to the metal interconnect 10 and removing of the heat source 16 (and in some cases, actively cooling of the metal interconnect 10) increases a hardness of the metal interconnect 10. That is, the process performed according to various embodiments reduces a grain size of the metal interconnect 10, making the wafer kerf 4 easier to dice (cut) in a subsequent dicing process. In some cases, the process can further include:

Process P3: dicing the IC wafer 2 along the wafer kerf 4 after the removing of the heat source and the cooling of the metal interconnect 10. As described herein, the process of applying localized heat and cooling of the metal interconnect 10 enhances the efficiency of this dicing process.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
    applying localized heat to a metal interconnect in a wafer kerf on an integrated circuit (IC) wafer using a heat source; and
    removing the heat source to cool the metal interconnect after the applying of the localized heat to the metal interconnect,
    wherein the applying of the localized heat and the removing of the heat source increases a hardness of the metal interconnect,
    the applying of the localized heat including:
        connecting the heat source to a probe pad on an upper surface of the IC wafer,
        wherein the probe pad is electrically connected with the metal interconnect in the wafer kerf,
        wherein the metal interconnect is at least partially surrounded by a dielectric; and
        heating the probe pad to increase a temperature of the metal interconnect to a greater temperature than a temperature of the dielectric at least partially surrounding the metal interconnect.

2. The method of claim 1, wherein the IC wafer includes a post-test wafer, and wherein the applying of the localized heat is performed after performance testing of the post-test wafer.

3. The method of claim 1, wherein the connecting of the heat source to the probe pad includes contacting the probe pad with a ceramic heating element.

4. The method of claim 1, further comprising actively cooling the metal interconnect after the removing of the heat source.

5. The method of claim 1, wherein the applying of the localized heat and the removing of the heat source to cool the metal interconnect reduces a grain size of the metal interconnect.

6. The method of claim 1, further comprising dicing the IC wafer along the wafer kerf after the removing of the heat source and the cooling of the metal interconnect.

7. The method of claim 1, wherein the applying of the localized heat includes applying a focused laser light to the metal interconnect.

8. A method comprising:
   contacting a heating element to a probe pad on an IC wafer, the IC wafer including:
      a wafer kerf separating adjacent IC chips, the wafer kerf including a metal interconnect electrically connected with the probe pad; and
      a dielectric at least partially surrounding the metal interconnect;
   heating the probe pad with the heating element to raise a temperature of the metal interconnect while maintaining a temperature of the dielectric below the temperature of the metal interconnect; and
   removing the heating element from the probe pad to cool the metal interconnect after the heating of the probe pad,
   wherein the heating of the probe pad and the removing of the heating element increases a hardness of the metal interconnect.

9. The method of claim 8, wherein the IC wafer includes a post-test wafer, and wherein the contacting and the heating are both performed after performance testing of the post-test wafer.

10. The method of claim 8, wherein the heating element includes a ceramic heating element.

11. The method of claim 8, wherein the metal interconnect includes aluminum, wherein the method further comprises actively cooling the metal interconnect after the removing of the heating element from the probe pad.

12. The method of claim 8, wherein the metal interconnect includes copper, wherein the method further comprises passively cooling the metal interconnect after the removing of the heating element from the probe pad.

13. The method of claim 8, wherein the raising of the temperature of the metal interconnect and the removing of the heating element from the probe pad to cool the metal interconnect reduces a grain size of the metal interconnect.

14. The method of claim 8, further comprising dicing the IC wafer along the wafer kerf after the removing of the heating element.

15. A method comprising:
   contacting a ceramic heating element to a probe pad on an IC wafer, the IC wafer including:
      a wafer kerf separating adjacent IC chips, the wafer kerf including a metal interconnect electrically connected with the probe pad; and
      a dielectric at least partially surrounding the metal interconnect;
   heating the probe pad with the ceramic heating element to raise a temperature of the metal interconnect while maintaining a temperature of the dielectric below the temperature of the metal interconnect;
   removing the heating element from the probe pad to cool the metal interconnect after the heating of the probe pad,
   wherein the heating of the probe pad and the removing of the heating element increases a hardness of the metal interconnect; and
   dicing the IC wafer along the wafer kerf after the removing of the heating element.

16. The method of claim 15, wherein the metal interconnect includes aluminum, wherein the method further comprises actively cooling the metal interconnect after the removing of the heating element from the probe pad.

17. The method of claim 15, wherein the metal interconnect includes copper, wherein the method further comprises passively cooling the metal interconnect after the removing of the heating element from the probe pad.

18. The method of claim 15, wherein the raising of the temperature of the metal interconnect and the removing the heating element from the probe pad to cool the metal interconnect reduces a grain size of the metal interconnect.

19. The method of claim 15, wherein the IC wafer includes a post-test wafer, and wherein the contacting and the heating are both performed after performance testing of the post-test wafer.

* * * * *